(12) United States Patent
Beards et al.

(10) Patent No.: US 6,417,712 B1
(45) Date of Patent: Jul. 9, 2002

(54) PHASE SHIFTER USING SINE AND COSINE WEIGHTING FUNCTIONS

(75) Inventors: R. Douglas Beards, Mountain; John J. Nisbet, Nepean; Qi Tang, Ottawa; Eric Gagnon, Chelsea, all of (CA)

(73) Assignee: Nortel Networks Limited, St. Laurent (CA)

( * ) Notice: Subject to any disclaimer, the term of this patent is extended or adjusted under 35 U.S.C. 154(b) by 24 days.

(21) Appl. No.: 09/669,874

(22) Filed: Sep. 27, 2000

(51) Int. Cl.$^7$ .................................................. H03K 5/13
(52) U.S. Cl. ....................... 327/248; 327/231; 327/256; 327/355
(58) Field of Search ................................ 327/105, 116, 327/355, 357, 231, 248, 256, 100

(56) References Cited

U.S. PATENT DOCUMENTS

| | | | |
|---|---|---|---|
| 4,584,583 A | * | 4/1986 | Dennis, Jr. et al. .......... 343/380 |
| 4,833,479 A | * | 5/1989 | Carson ........................ 342/194 |
| 4,987,386 A | * | 1/1991 | Poklemba et al. ............ 331/10 |
| 5,355,103 A | | 10/1994 | Kozak ........................... 333/81 |
| 5,463,355 A | | 10/1995 | Halloran ....................... 332/103 |

OTHER PUBLICATIONS

C. Toumazous, et al. "Analogue IC design: the current–mode approach", Current–mode Circuits From a Translinear Viewpoint, pp. 86–87, 1990.

Paul R. Gray, et al., "Analysis and Design of Ananlog Integrated Circuits" Analog Multipliers Employing the Bipolar Transistor, pp. 590–600, 1984.

* cited by examiner

*Primary Examiner*—Dinh T. Le (57) ABSTRACT

Sine and cosine weighting functions are applied to phase quadrature versions of an input signal to be phase shifted, and the weighted results are summed to provide a phase shifted output signal with an amplitude which is relatively independent of the phase shift. A weighting circuit comprises two translinear sine shaping circuits having differential current outputs providing weighting signals from input currents supplied thereto, the input currents of the two sine shaping circuits being offset relative to one another so that the differential current outputs of the two sine shaping circuits are provided in accordance with a sine function and a cosine function, respectively, of a control signal.

14 Claims, 5 Drawing Sheets

PHASE SHIFTER USING SINE AND COSINE WEIGHTING FUNCTIONS

This invention relates generally to phase shifters, and is particularly concerned with a phase shifter which can provide a substantially linear variable phase shifting characteristic with a relatively constant amplitude, i.e. a phase shifter which does not introduce spurious amplitude changes of the phase shifted signal.

BACKGROUND OF THE INVENTION

It is known to provide a vector modulator for providing a controlled phase shift and amplitude gain (or attenuation) for a supplied signal; for example a vector modulator can comprise a variable phase shifter and a variable gain amplifier. Such a vector modulator can for example be provided in a loop with a tuning element, such as a surface acoustic wave device, to provide an oscillator.

In order to provide a versatile form for such a vector modulator, it is desirable for it to provide separate and independent control of the phase shift and gain which it provides. While it is relatively easy to provide a variable gain amplifier which does not introduce substantial phase changes, it is relatively difficult to provide a phase shifter which provides a variable phase shift without introducing substantial amplitude changes. This difficulty is increased by a requirement for wide band operation of the phase shifter with a substantially linear relationship between a phase shift control voltage and the resulting phase shift, especially over a relatively large range of phase shifts, and may be further increased by other requirements, such as for stability against temperature and/or production process variations.

A need exists, therefore, to provide an improved phase shifter.

SUMMARY OF THE INVENTION

According to one aspect, this invention provides a phase shifter comprising: a phase splitter for producing two phase quadrature signals from an input signal; a weighting circuit for producing two weighting signals in accordance with sine and cosine functions of a control signal; two multipliers for multiplying each of the two phase quadrature signals by a respective one of the two weighting signals to produce a respective one of two products; and a summing circuit for summing the two products to produce an output signal which is phase shifted from the input signal in dependence upon the control signal.

Thus sine and cosine weighting functions are applied to phase quadrature versions of the input signal to be phase shifted, and the weighted results are summed to provide a phase shifted output signal with an amplitude which is relatively independent of the phase shift.

The input signal typically comprises a high frequency signal, for which conveniently the phase splitter comprises a polyphase network and each of the multipliers comprises a four-quadrant multiplier such as a Gilbert Cell multiplier.

Preferably the weighting circuit comprises two translinear sine shaping circuits each having differential current outputs providing a respective one of the two weighting signals from input currents supplied thereto, and a circuit for providing the input currents to the two sine shaping circuits in dependence upon the control signal, the input currents of the two sine shaping circuits being offset relative to one another whereby the differential current outputs of the two sine shaping circuits are provided in accordance with a sine function and a cosine function, respectively, of the control signal.

The circuit for providing the input currents to the two sine shaping circuits in dependence upon the control signal can comprise a circuit for providing a reference current; a differential amplifier responsive to the control signal for producing differential control currents dependent upon the reference current and the control signal; and a plurality of current mirror circuits for producing the input currents to the two sine shaping circuits from the reference current and the differential currents.

The invention also provides an analogue method of phase shifting a high frequency input signal in dependence upon a control signal, comprising the steps of: splitting the input signal into two components in phase quadrature; multiplying the two phase quadrature components by respective weights determined in accordance with sine and cosine functions, respectively, of the control signal to produce respective product signals; and summing the product signals to produce a phase shifted output signal having an amplitude substantially independent of its phase shift.

The step of multiplying the two phase quadrature components by respective weights can comprise producing each of said weights as differential currents and reducing the differential currents by a fixed current; this has the advantageous effect of reducing minimum insertion loss of the phase shifter.

The step of multiplying the two phase quadrature components by respective weights can comprise producing said weights as differential currents in two translinear sine shaping circuits in dependence upon currents supplied to the sine shaping circuits, and producing the currents supplied to the two sine shaping circuits in dependence upon the control signal and offset from one another for the two sine shaping circuits to provide said sine and cosine functions, respectively.

Another aspect of the invention provides a weighting circuit for producing weights in accordance with sine and cosine functions of a control signal, the weighting circuit comprising two similar translinear sine shaping circuits each responsive to supplied currents of $(1-X)I$, $2I$, and $(1+X)I$, where I is a reference current and X is a control variable within a range $-1<X<1$, to provide differential currents in accordance with a sine function of X, and a current supply circuit for supplying said currents to the two translinear sine shaping circuits with the variable X for the currents supplied to one of the two translinear sine shaping circuits offset by 0.5 from the variable X for the currents supplied to the other of the two translinear sine shaping circuits to provide said differential currents in accordance with a cosine function instead of a sine function, the differential currents provided by the two translinear sine shaping circuits constituting said weights.

Preferably the current supply circuit comprises a source for the reference current I, a differential amplifier responsive to the control signal for producing differential control currents dependent upon the reference current and the control signal, and a plurality of current mirror circuits for producing the currents supplied to the two translinear sine shaping circuits from the reference current and the differential currents.

The current supply circuit is conveniently arranged for supplying said currents to said one of the two translinear sine shaping circuits with the variable X within a range $-0.5<X<0.5$ and to said other of the two translinear sine shaping circuits with the variable X within a range $0<X<1$.

The invention further provides a method of producing weights in accordance with sine and cosine functions of a control signal, comprising: producing a first set of currents (3I/2)−Ic, 2I, and (I/2)+Ic, where I is a reference current and Ic is a controlled current less than I and dependent upon the control signal; producing a second set of currents I−Ic, 2I, and I+Ic; and supplying the first and second sets of currents respectively to first and second similar translinear sine shaping circuits, each of the translinear sine shaping circuits being responsive to supplied currents of (1−X)I, 2I, and (1+X)I respectively to provide differential output currents in accordance with a sine function of a control variable X within a range −1<X <1, whereby said differential output currents of the first and second translinear sine shaping circuits constitute said weights in accordance with sine and cosine functions of the control signal.

BRIEF DESCRIPTION OF THE DRAWINGS

The invention will be further understood from the following description with reference to the accompanying drawings, in which by way of example:

FIG. 8, which is on the same sheet as FIGS. 1 to 3, illustrates how FIGS. 7A, 7B, and 7C are arranged to form a complete view.

DETAILED DESCRIPTION

Figure 1:
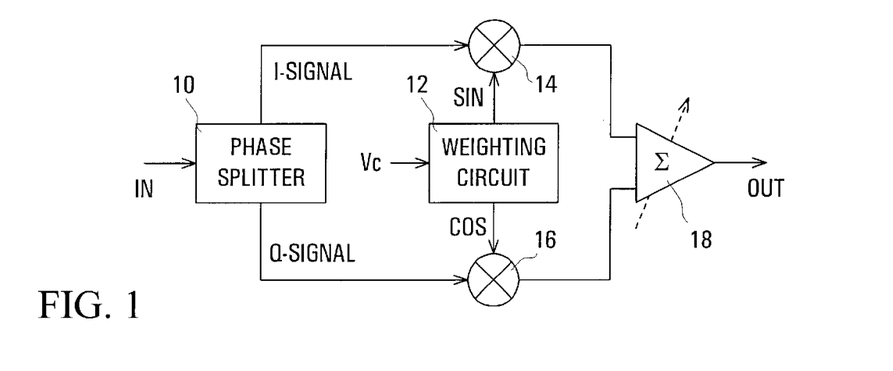
FIG. 1 illustrates in a block diagram a phase shifter in accordance with an embodiment of this invention.

Referring to the drawings, FIG. 1 illustrates a block diagram of a phase shifter in accordance with an embodiment of this invention, in which an input signal, for example a high frequency signal, supplied to an input IN is provided with a variable phase shift determined by a control voltage Vc, to produce a phase shifted output signal at an output OUT. The phase shifter comprises a phase splitter 10, a weighting circuit 12, multipliers 14 and 16, and a summing amplifier 18.

The phase shifter of FIG. 1 is arranged as described below to avoid undesired changes in the amplitude of the signal being phase shifted, i.e. to operate as a constant amplitude phase shifter. However, as indicated by a dashed line in conventional manner, the summing amplifier 18 may be provided with a variable gain (with constant phase) to provide a desired and controlled variable amplitude change in the phase shifted signal, so that the phase shifter constitutes a vector modulator with independently controlled phase shift and gain. As such a constant phase controllable gain amplifier can be provided in known manner (for example, a controllable gain amplifier stage may be provided following the summing amplifier stage) and operates independently of the phase shifter itself, it is not further described below.

The phase splitter 10 splits the input signal into two signals in phase quadrature. These two signals, constituting in-phase and quadrature-phase components of the input signal, are referred to below as an I-signal and a Q-signal respectively. The I-signal is supplied to an input of the multiplier 14, and the Q-signal is supplied to an input of the multiplier 16. The weighting circuit 12 is supplied with the control voltage Vc, and produces weighting signals in dependence upon the control voltage in accordance with sine (sin) and cosine (cos) functions as further described below, these weighting signals being supplied to another input of the multipliers 14 and 16 respectively.

The multiplier 14 multiplies the I-signal by the sine weighting signal, and the multiplier 16 multiplies the Q-signal by the cosine weighting signal, the products being summed by the summing amplifier 18 to produce the phase shifted signal at its output.

Figure 2:
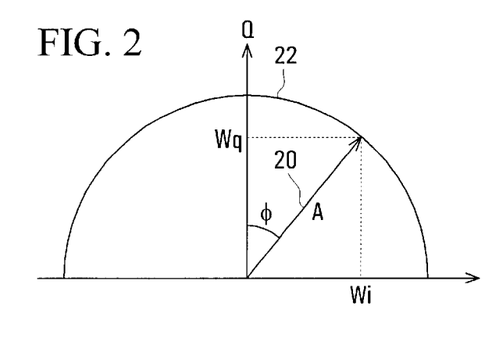
FIG. 2 is a phase-plane diagram useful for understanding constant amplitude phase shifting in accordance with the invention.

The constant amplitude phase shifting operation of the phase shifter of FIG. 1 can be understood from the phase plane diagram of FIG. 2. In this diagram, a horizontal axis I represents the 0° phase component or I-signal, and a vertical axis Q represents the 90° phase component or Q-signal; the diagram shows only the two quadrants for which the Q axis has positive values. A weight Wi for the I-signal and a weight Wq for the Q-signal result in a vector 20 of amplitude A which makes an angle φ with the positive Q axis.

It can be seen from FIG. 2 that sin φ=Wi/A and that cos φ=Wq/A. Since $\sin^2 \phi + \cos^2 \phi = 1$, it follows that $Wi^2 + Wq^2 = A^2$; this is the equation of a circle of radius A. Consequently, it can be seen that the sine and cosine weighting functions ensure that the vector A follows a circular path 22 as the angle φ changes; i.e. the vector A has a constant amplitude with changing phase, as is desired of the phase shifter.

Although the phase shifter of FIG. 1 is simple in principle, its practical realization presents difficulties in view of requirements for such a phase shifter. For example, such requirements can include operation over a wide frequency band and over a wide temperature range, a linear relationship between phase change and control voltage change over a wide phase range, approaching 180°, with monotonic behaviour outside this range, and implementation in an integrated circuit form despite process variations, all while maintaining the substantially constant amplitude phase change desired.

In this respect it is observed that, while a sine generating circuit is known, generating a cosine weighting function presents difficulties especially for providing a linear phase relationship with control voltage despite temperature and process variations. A cosine function can be derived from a sine function in accordance with the equation $\cos \phi = \sqrt{(1 - \sin^2 \phi)}$ by mirroring current from the output of a sine function circuit into a translinear vector sum circuit, but the resulting circuit is very sensitive to current errors because of the squared term in this equation. In addition, an implementation of such a circuit for operation at high frequencies, for which lateral PNP transistors are inferior to vertical NPN transistors, places heavy reliance on PNP transistor current mirrors and thus is unreliable.

Figure 3:
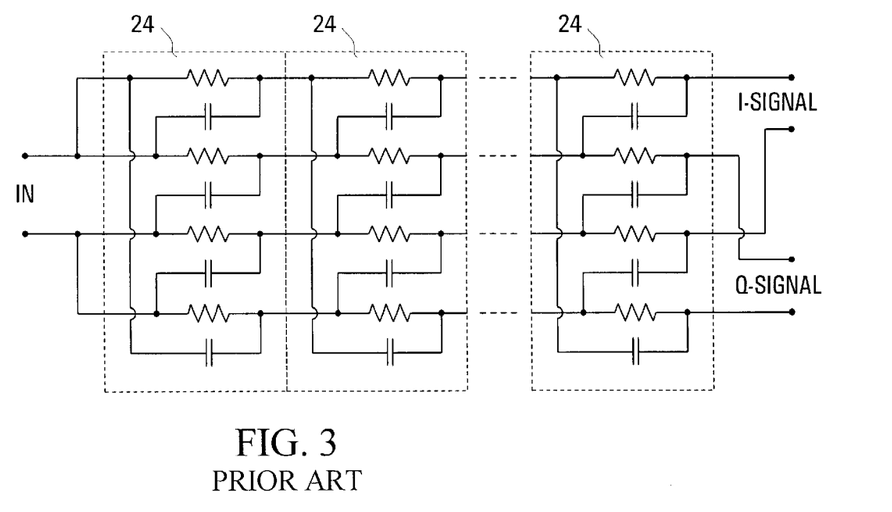
FIG. 3 illustrates a known form of phase splitter which can be used in the phase shifter of FIG. 1.

The phase splitter 10 can have a known form, and is preferably constituted by a symmetrical polyphase network of the known form illustrated in FIG. 3. As illustrated in FIG. 3, the symmetrical polyphase network comprises a plurality of network sections 24, each shown within a dashed line box, each having four inputs and four outputs via which the network sections are connected together in cascade. Each network section comprises four resistors connected between the respective inputs and outputs of the network section, and four capacitors cross-connected between the four outputs and respective adjacent inputs of the network section. An input signal is supplied to an input IN of the first network section, and the phase quadrature I-signal and Q-signal are derived from the outputs of the last network section. These signals, and other signals throughout the description below, are preferably balanced or differential signals as illustrated, but it can be appreciated that any or all of the signals could instead be unbalanced or single-ended signals.

The symmetrical polyphase network phase splitter of FIG. 3 can provide phase quadrature signals over a wide bandwidth, can be implemented on an integrated circuit chip, and is relatively insensitive to component tolerances. For example, such a network can comprise four network sections 24, with 0.125, 0.25, 0.5, and 1 pF capacitors respectively and all with 512Ω resistors, for operation in a frequency band from about 300 MHz to about 3 GHz.

Each of the multipliers 14 and 16 can also have a known form, and preferably comprises a four-quadrant Gilbert Cell multiplier. Although a two-quadrant multiplier could theoretically be used for the multiplier 16 because the cosine weighting is always positive for a phase shift φ up to ±90° as shown in FIG. 2, this would require high current PNP transistor current sources to cancel a common mode component of a cosine weighting current, and this is impractical for high frequency operation. Thus a four-quadrant multiplier, which can operate with the common mode weighting current, is also preferable for this multiplier 16. Each of the multipliers 14 and 16 can comprise a Gilbert Cell multiplier having the known form illustrated in FIG. 4.

Figure 4:
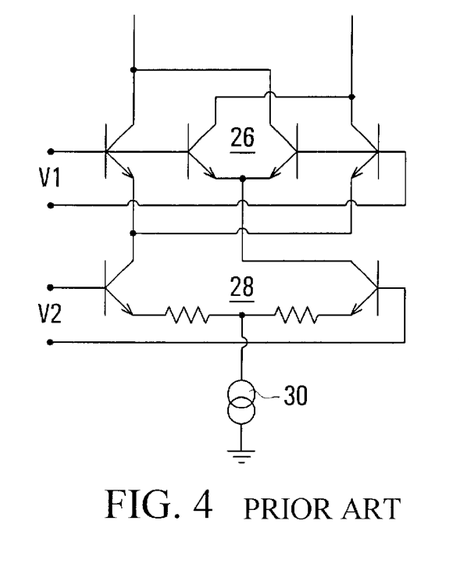
FIG. 4 illustrates a known Gilbert Cell multiplier which can be used in the phase shifter of FIG. 1.

As illustrated in FIG. 4, the Gilbert Cell multiplier comprises an upper quad of NPN transistors 26 having their collectors and emitters cross-connected in pairs and a differential input signal V1 supplied to their bases, and a lower differential pair of NPN transistors 28 having their collectors connected to the emitters of the upper quad of transistors 26, a differential input signal V2 supplied to their bases, and their emitters connected via degeneration resistors to a current source 30. (For simplicity throughout this description, the term "current source" is used to denote either a current source or a current sink, i.e. independently of the direction of current.) Collector currents of the upper quad of transistors 26 constitute a differential output signal representing the product of the input signals V1 and V2.

Figure 5:
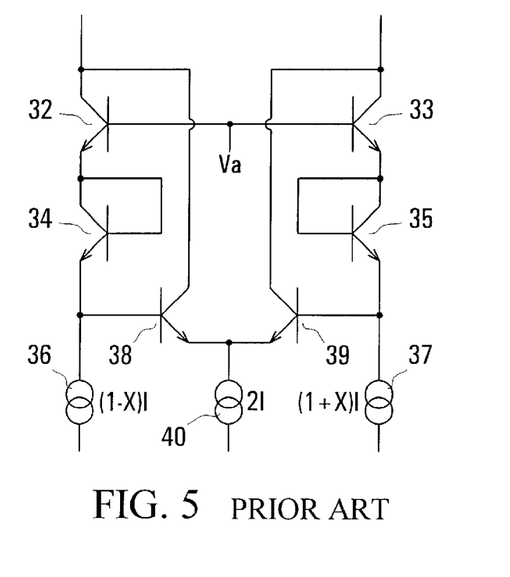
FIG. 5 illustrates a known translinear sine shaping circuit which can be used in the phase shifter of FIG. 1.

The weighting circuit 12 in the phase shifter of FIG. 1 must provide a sine weighting function; this can be provided using a translinear sine shaping circuit which can have a known form as illustrated in FIG. 5.

Referring to FIG. 5, the sine shaping circuit comprises an NPN transistor 32 having its collector providing one of two differential outputs for a sine weighting current, its base connected to a reference potential Va which may for example be ground or zero volts, and its emitter connected via a diode-connected NPN transistor 34 to a current source 36 and to the base of an NPN transistor 38. The transistor 38 has its collector connected to the collector of the transistor 32 and its emitter connected to a current source 40, which is common to a symmetrical arrangement of transistors 33, 35, and 39 and current source 37 for providing another of the differential outputs at the collectors of the transistors 33 and 39.

Figure 6:
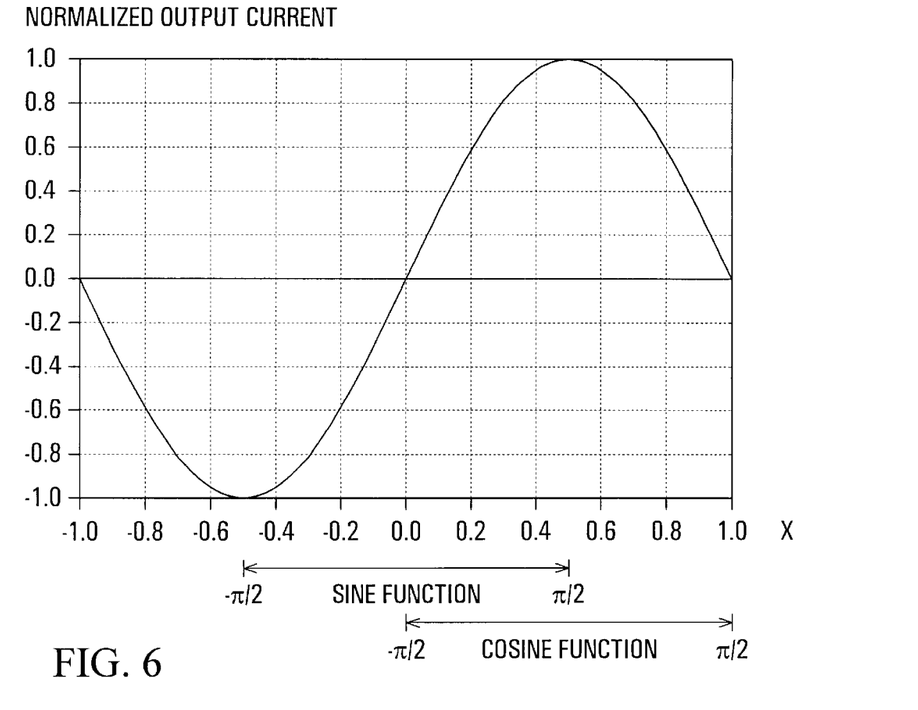
FIG. 6 is a diagram useful for understanding operation of the shaping circuit of FIG. 5 in the phase shifter of FIG. 1.

Denoting an arbitrary current as I, in the circuit of FIG. 5 the current source 40 is arranged to pass a current 2I, the current source 36 is controlled to pass a current (1−X)I, and the current source 37 is controlled to pass a current (1+X)I, where X is a control parameter in the range −1<X<1 corresponding to an angular or phase range from −π to π. The resulting differential current output at the collectors of the transistors 32, 38 and 33, 39 in the circuit of FIG. 5 varies substantially sinusoidally with linear changes in X, as shown in FIG. 6. In FIG. 6, the horizontal axis represents values of X from −1 to 1, and the vertical axis represents output current normalized to peak values of ±1, the peak current actually having a value of about 0.3I. It is observed that this sinusoidal response does not continue for values of X beyond ±1.

As discussed above, the weighting circuit 12 in the phase shifter of FIG. 1 must also provide a cosine weighting function. Despite the difficulty in the prior art of providing a suitably stable and reliable cosine function, in embodiments of the invention this is provided in a relatively simple and elegant manner by modifying a second translinear sine shaping circuit of the form shown in FIG. 5.

Referring again to FIG. 6, it can be appreciated that values of X from 0 to 1 provide a cosine function for an angular range of −π/2 to π/2 as illustrated. Thus by modifying the current sources 36 and 37 in the circuit of FIG. 5 so that they pass currents offset by I/2, corresponding to a value of X of 0.5, i.e. so that the current source 36 passes a current of (0.5−X)I and the current source 37 passes a current of (1.5+X)I for values of X in the range −0.5<X<0.5, the circuit of FIG. 5 provides a cosine function for this limited angular range. A sine function is provided by the circuit of FIG. 5 for the same angular range of −π/2 to π/2 for values of X from −0.5 to 0.5, this merely being a restriction of the range of operation of the known circuit of FIG. 5.

Thus in embodiments of the invention, as described further below, the weighting circuit 12 provides two translinear sine shaping circuits of the form shown in FIG. 5 each of which operates over the angular range of about −π/2 to about π/2, one of them having the currents passed by the current sources 36 and 37 in FIG. 5 offset by an amount equivalent to a phase angle of π/2 to provide a cosine function instead of a sine function. Thus the desired cosine weighting function is provided in a manner that is stable against temperature and process variations, matched to the provision of the sine function, and not subject to significant errors. In this respect it is observed that according to the prior art the peak non-linearity of the sine shaping circuit of FIG. 5 is 2.7%, and that this can be reduced to 0.4% with some adjustment of center current, so that the circuit can provide an accurate sinusoidal response.

Figure 7A:
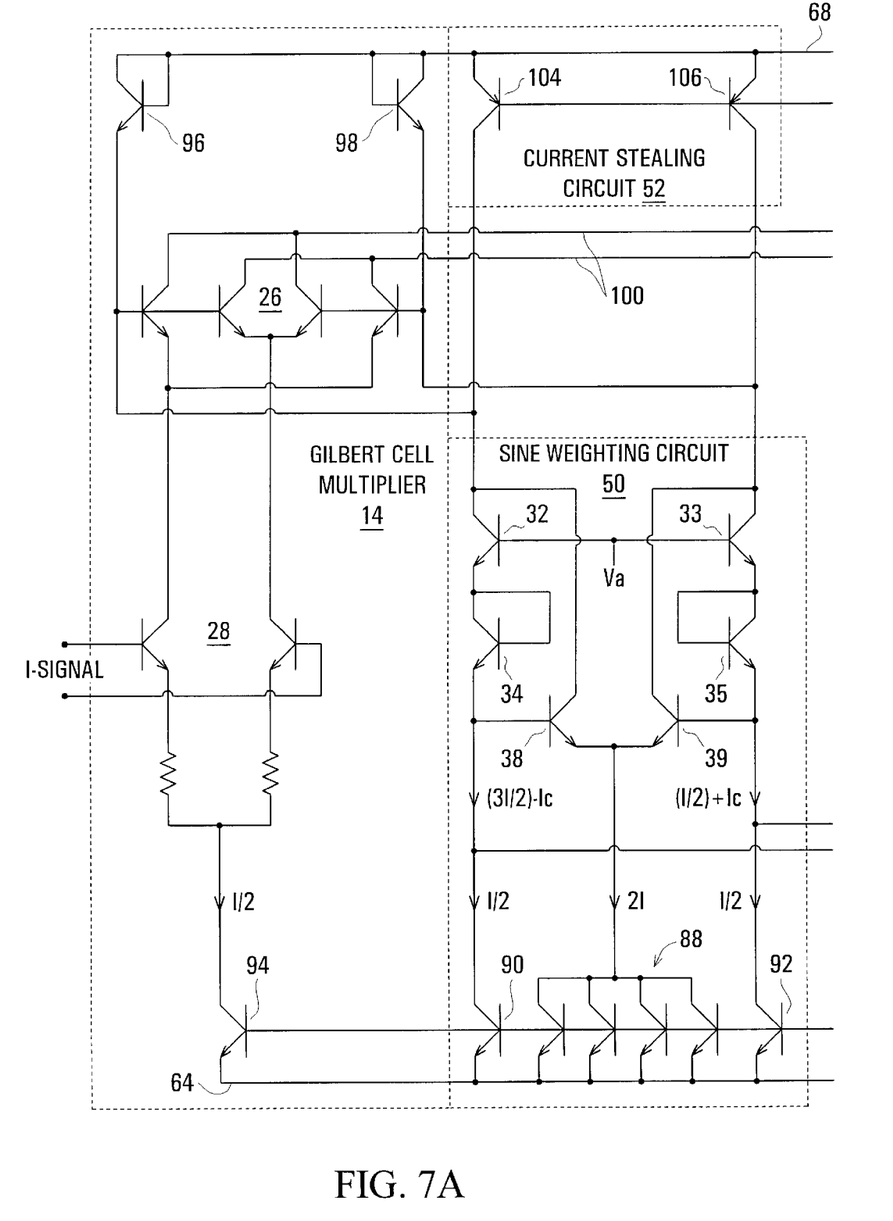
FIGS. 7A, 7B, and 7C illustrate a circuit diagram of an implementation of parts of the phase shifter of FIG. 1.
Figure 7B:
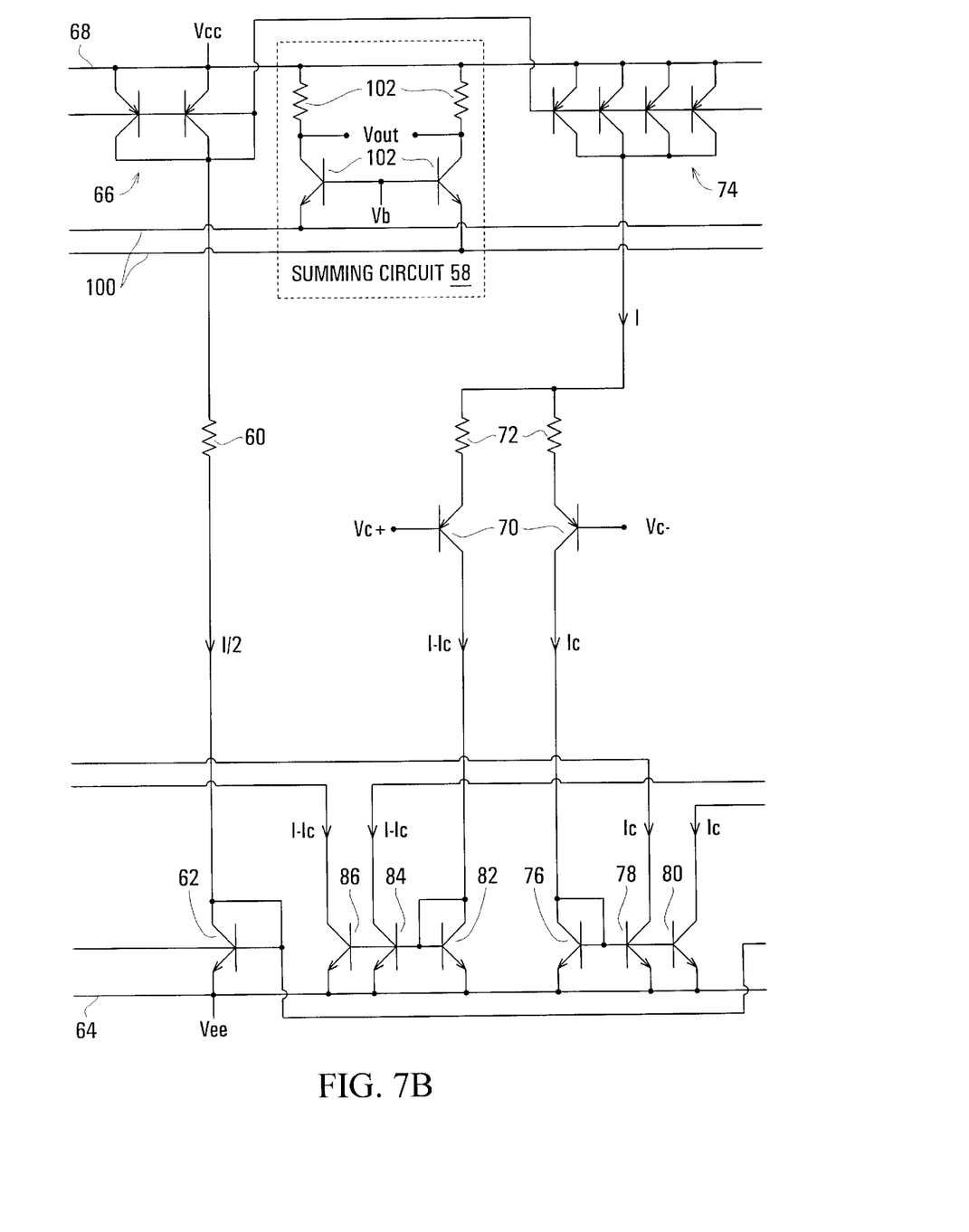
Figure 7C:
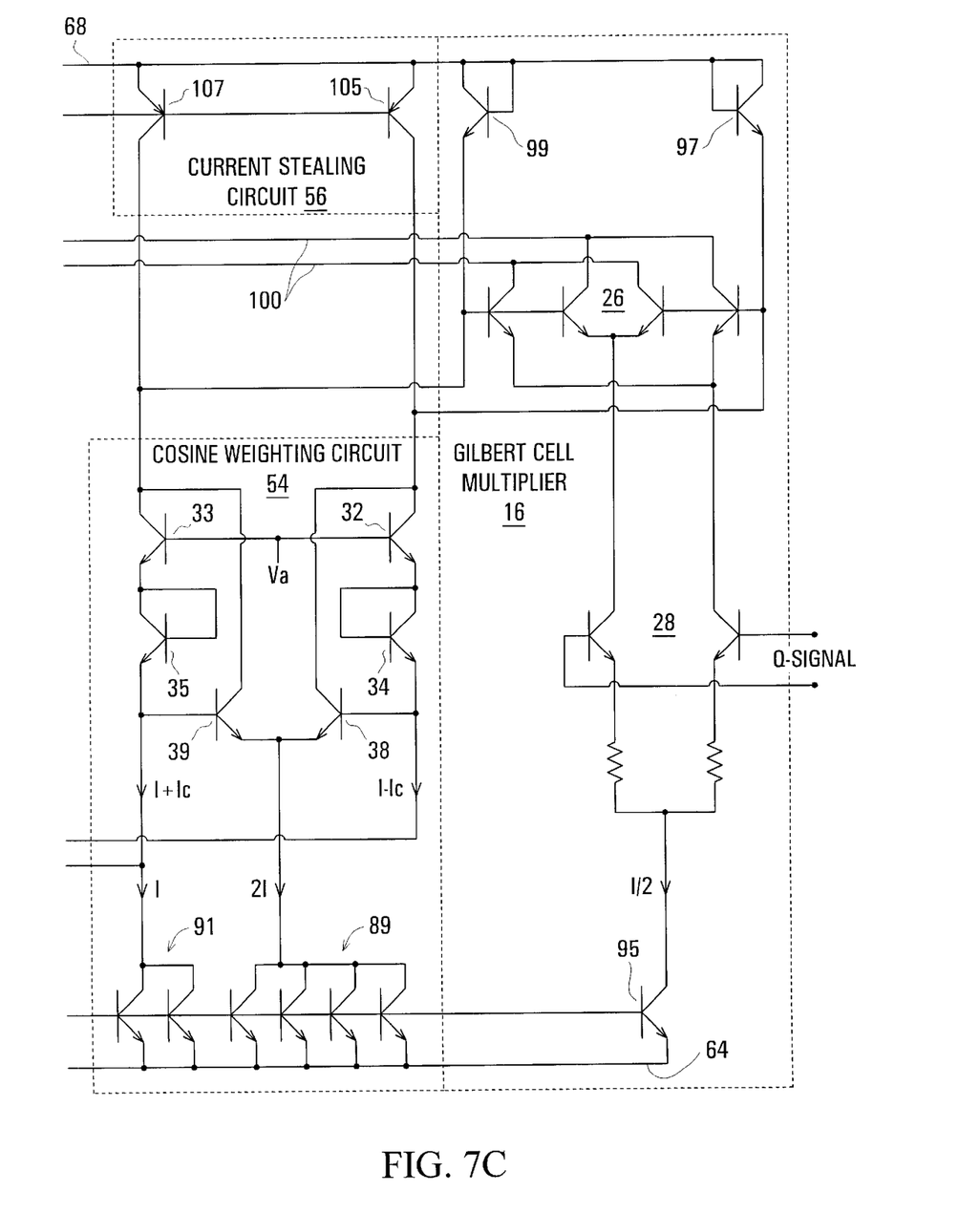
Figure 8:
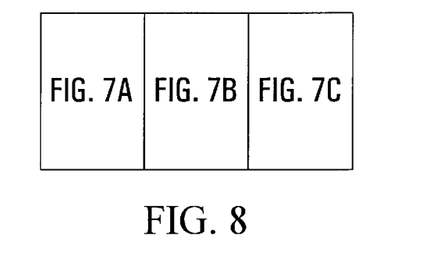

FIGS. 7A, 7B, and 7C, when arranged side by side as shown in FIG. 8, provide a schematic circuit diagram of the weighting circuit 12, multipliers 14 and 16, and an input summing circuit of the summing amplifier 18 of a resulting implementation of the phase shifter of FIG. 1 in accordance with an embodiment of the invention; the phase splitter 10 can be constituted by the network of FIG. 3 as already described above. FIG. 7A shows the multiplier 14, a sine weighting circuit 50, and a current stealing circuit 52 in dashed line boxes; FIG. 7C shows the multiplier 16, a cosine weighting circuit 54, and a current stealing circuit 56 in dashed line boxes; and FIG. 7B shows the input summing circuit, referenced 58, of the summing amplifier 18 in a dashed line box, and current control circuits constituting the remainder of the weighting circuit 12. The current stealing circuits 52 and 56 are optionally provided to improve performance as described later below, but they can be omitted. For simplicity, the description immediately below assumes that these current stealing circuits 52 and 56 are not present.

Referring initially to FIG. 7B, a resistor 60 is coupled between a diode-connected NPN transistor 62, whose emitter is connected to a line 64 to which a relatively negative supply voltage Vee is supplied, and a pair of parallel diode-connected PNP transistors 66, whose emitters are connected to a line 68 to which a relatively positive supply voltage Vcc is supplied. The resistance of the resistor 60 determines a reference current I/2 which flows via the transistor 62, and a reference current I/4 which flows via each of the transistors 66. The PNP transistors 66 are arranged in parallel to conduct currents half those of the NPN transistors in view of their implementation as horizontal transistors in an integrated circuit form of the phase shifter for operation at high frequencies, and to facilitate mirroring of the current I/4 for the current stealing circuits as described later below. The reference current I/2 which flows via the resistor 60 is represented by an arrow on the connection line between this resistor and the transistor 62 and the adjacent designation "I/2", and similar indications are used for other lines to denote their respective currents.

The control voltage Vc in the phase shifter of FIG. 1 is constituted by differential control voltages Vc+ and Vc− which are supplied to the bases of a differential pair of PNP transistors 70. The emitters of the transistors 70 are connected via respective degeneration resistors 72 to the collectors of four parallel-connected transistors 74, whose emitters are connected to the Vcc line 68 and whose bases are connected to the bases of the transistors 66. Consequently, the transistors 74 mirror a total current I which is divided between the transistors 70 in accordance with the control voltage. Thus if one of the transistors 70 conducts a controlled current Ic, this being substantially linearly dependent on the control voltage, then the other conducts a similarly controlled current I−Ic as illustrated. With a control voltage range of about ±5 volts providing a linear phase angle range of ±π/2, a differential control voltage of zero corresponds to a 0° phase shift and equal currents of the transistors 70, so that in this "neutral" situation Ic=I/2 and I−Ic=I/2.

The current Ic is conducted by a diode-connected NPN transistor 76, coupled between the collector of one of the transistors 70 and the Vee line 64, and is mirrored by two transistors 78 and 80, having their bases connected to the base of the transistor 76 and having their emitters connected to the Vee line 64. Consequently, the current Ic is also conducted via the collector of each of these transistors 78 and 80, as illustrated. Similarly, the current I−Ic is conducted by a diode-connected NPN transistor 82, coupled between the collector of the other of the transistors 70 and the Vee line 64, and is mirrored by two transistors 84 and 86, having their bases connected to the base of the transistor 82 and having their emitters connected to the Vee line 64. Consequently, the current I−Ic is also conducted via the collector of each of these transistors 84 and 86, as illustrated.

Referring now to FIG. 7A, the sine weighting circuit 50 includes four parallel-connected NPN transistors 88, whose emitters are connected to the Vee line 64 and whose bases are connected to the base of the transistor 62, each of which mirrors the current I/2 passed by the transistor 62 to provide a total current of 2I. These transistors 88 correspond to the current source 40 in the translinear sine shaping circuit of FIG. 5, which is reproduced in the sine weighting circuit 50 of FIG. 7A, in which accordingly the transistors of this circuit are denoted by the same references as in FIG. 5.

The sine weighting circuit 50 also includes further NPN transistors 90 and 92, also having their bases connected to the base of the transistor 62 and having their emitters connected to the Vee line 64, each of which mirrors the current I/2 passed by the transistor 62. The transistors 86 and 90 have their collectors connected together and to the junction of the emitter of the transistor 34 and the base of the transistor 38, so that they constitute the current source 36 of FIG. 5, conducting a combined current of (3I/2)−Ic. Also, the transistors 78 and 92 have their collectors connected together and to the junction of the emitter of the transistor 35 and the base of the transistor 39, so that they constitute the current source 37 of FIG. 5, conducting a combined current of (I/2)+Ic. It can be seen these combined currents correspond to the currents (1−X)I and (1+X)I respectively, described above with reference to FIG. 5, with values of X from −0.5 to 0.5 corresponding to values of the controlled current Ic from 0 to I respectively, with the neutral condition of Ic=I/2 corresponding to X=0 at the center of the sine function range from −π/2 to π/2 as shown in FIG. 6.

As indicated above, the multiplier 14 is constituted by a Gilbert Cell multiplier as described above with reference to FIG. 4, and the upper quad of transistors 26 and the lower differential pair of transistors 28 are given the same references in FIG. 7A. The current source 30 of FIG. 4 is constituted by an NPN transistor 94, having its base connected to the base of the transistor 62 and its emitter connected to the Vee line 64, which mirrors the current I/2 passed by the transistor 62 for the Gilbert Cell multiplier.

The I-signal is supplied as the input V2 to the bases of the lower differential pair of transistors 28, whose collectors are connected to the emitters of the upper quad of transistors 26. The outputs of the sine weighting circuit 50, i.e. the interconnected collectors of the transistors 32, 38 and 33, 39, are connected to the bases of the upper quad of transistors 26 and to the emitters of two NPN transistors 96 and 98 respectively, whose bases and collectors are connected to the Vcc line 68. These diode-connected transistors 96 and 98 serve to convert the differential current output of the sine weighting circuit 50 into logarithmic voltages applied as the input V1 to the bases of the transistors 26, to provide an overall substantially linear multiplication of signals by the Gilbert Cell multiplier 14, a differential current output of which is produced on lines 100 connected to the collectors of the upper quad of transistors 26.

Referring to FIG. 7C (which it is observed is drawn in mirrored fashion to FIG. 7A), the Gilbert Cell multiplier 16 is arranged in a similar manner to the multiplier 14, with the differential current outputs of the cosine weighting circuit 54 supplied to diode-connected NPN transistors 97 and 99 connected between the bases of the upper quad of transistors 26 and the Vcc line 68. The Q-signal is supplied to the bases of the lower differential pair of transistors 28 whose collectors are connected to the emitters of the upper quad of transistors 26. An NPN transistor 95, having its base connected to the base of the transistor 62 and its emitter connected to the Vee line 64, provides a mirrored current I/2 for the multiplier. Collectors of the upper quad of transistors 26 are connected to the differential current output lines 100.

As shown in FIG. 7B, the lines 100 are connected in the summing circuit 58 to the emitters of respective NPN transistors 102, whose bases are connected to a suitable bias voltage Vb and whose collectors provide a summed differential output voltage Vout and are connected via respective resistors 104 to the Vcc line 68. The summing circuit 58 thus comprises a differential common base amplifier of known form.

Referring again to FIG. 7C, the cosine weighting circuit 54 is similar to the sine weighting circuit 50 except for its current sources, which are arranged to provide a current offset for providing a cosine function instead of a sine function, as described above. Thus the cosine weighting circuit 54 includes the transistor arrangement of a translinear sine shaping circuit as described above with reference to FIG. 5. Accordingly, in FIG. 7C the transistors of this shaping circuit are denoted by the same references as in FIG. 5.

The current source arrangement of the cosine weighting circuit 54 includes four parallel-connected NPN transistors 89, whose emitters are connected to the Vee line 64 and whose bases are connected to the base of the transistor 62, each of which mirrors the current I/2 passed by the transistor 62 to provide a total current of 2I. The collectors of these transistors 89 are connected to the emitters of the transistors 38 and 39, and these transistors 89 correspond to the current source 40 in the translinear sine shaping circuit of FIG. 5.

The cosine weighting circuit 54 also includes a further pair of parallel-connected NPN transistors 91, also having their bases connected to the base of the transistor 62 and having their emitters connected to the Vee line 64, each of which mirrors the current I/2 passed by the transistor 62. The collectors of these transistors 91 thus pass a combined current I. The transistors 80 and 91 have their collectors connected together and to the junction of the emitter of the transistor 35 and the base of the transistor 39, so that they constitute the current source 37 of FIG. 5, conducting a combined current of I+Ic. The collector of the transistor 84 is connected to the junction of the emitter of the transistor 34 and the base of the transistor 38, so that it alone constitutes the current source 36 of FIG. 5, conducting a current of I−Ic.

For the cosine weighting circuit 54, it can be seen that these currents I−Ic and I+Ic correspond to the currents (1−X)I and (1+X)I respectively, described above with reference to FIG. 5, with values of X from 0 to 1 corresponding to values of the controlled current Ic from 0 to I respectively, and with the neutral condition of Ic=I/2 corresponding to X=0.5 at the center of the cosine function range from −π/2 to π/2 as shown in FIG. 6.

It can thus be appreciated that the different arrangement of the transistors 91 in the cosine weighting circuit 54 and providing a current I to only one side of the sine shaping circuit, compared with the symmetrical arrangement of the transistors 90 and 92 in the sine weighting circuit 50 providing equal currents I/2 to both sides of the sine shaping circuit, provides a cosine function rather than a sine function for the angular range from −π/2 to π/2.

The phase shifter as described above provides the desired characteristics of a relatively constant amplitude, wide band substantially linear phase response over an angular phase range of about 180° despite temperature and process variations, and can conveniently be provided in an integrated circuit for operation at high frequencies. The current stealing circuits 52 and 56 can also be included to provide improved performance, specifically a reduced minimum insertion loss of the phase shifter.

Referring to FIG. 7A, the current stealing circuit 52 comprises PNP transistors 104 and 106 having their bases connected to the bases of the transistors 66, their emitters connected to the Vcc line 68, and their collectors connected to the emitters of the transistors 96 and 98 respectively. Thus the transistors 104 and 106 each mirror the current I/4 conducted by each transistor 66, and reduce the currents conducted by the transistors 96 and 98, respectively, by this amount. Because the total current conducted by the transistors 96 and 98 is reduced by I/4, the ratio of current variation, due to the differential current provided by the sine weighting circuit 50, to total current conducted by the transistors 96 and 98 is increased, thereby reducing the minimum insertion loss. It can be appreciated that this is achieved indirectly, i.e. without changing the form of the sine weighting circuit 50, so that the accuracy of the sine weighting function is not adversely affected. In contrast, trying to reduce minimum insertion loss by modifying the sine weighting circuit tends to introduce undesired distortion of the sine function.

Similarly, referring to FIG. 7C, the current stealing circuit 56 comprises PNP transistors 105 and 107 having their bases connected to the bases of the transistors 66, their emitters connected to the Vcc line 68, and their collectors connected to the emitters of the transistors 97 and 99 respectively. Each of the transistors 105 and 107 likewise conducts a current of I/4, reducing the currents conducted by the transistors 97 and 99 by this amount.

The current I/4 conducted by each transistor of the current stealing circuits 52 and 56 is selected for convenience, and this current can be reduced or increased to provide a smaller or greater improvement in minimum insertion loss. However, increasing the current conducted by each of these transistors, and correspondingly reducing the currents conducted by the transistors 96 to 99 of the Gilbert Cell multipliers, ultimately degrades the performance of the phase shifter in other ways so that a compromise is necessary. In one embodiment, the current stealing circuits 52 and 56 reduced minimum insertion loss from about 16 dB to about 12 dB without detracting significantly from other performance factors of the phase shifter.

It will be appreciated that the degeneration resistors provided as described above in the emitter circuits of the differentially-connected transistors of the phase shifter facilitate providing the desired linear phase response of the phase shifter. The transistors 96 to 99 in the Gilbert Cell multipliers provide a similar linearization function for the upper quads of transistors 26 of the Gilbert Cell multipliers 14 and 16, for which degeneration resistors can not similarly be provided.

Although in each Gilbert Cell multiplier, as described above, the collectors of the lower differential pair of transistors 28 are connected to the emitters of the upper quad of transistors 26, and the outputs of the sine or cosine weighting circuits 52 or 56 are connected to the bases of the upper quad of transistors 26, these sets of connections could alternatively be interchanged. However, such interchanged connections result in a poorer noise figure for the phase shifter, and for this reason are not preferred.

Although as described above the currents for the sine and cosine weighting circuits 50 and 54 are arranged for a phase shift range of about 180°, it can be appreciated that a different phase shift range can be provided in a similar manner. In this respect it can be seen that within the range of FIG. 6 the sine and cosine functions can be extended to −π, with values of X of −1 and −0.5 respectively, so that the phase shift range can be expanded as well as reduced from the range of about 180° described above. Further, it can be appreciated that the phase shift range can be potentially expanded to about 360° if the currents supplied to the weighting circuits can be appropriately switched, in dependence upon the control voltage Vc, while still providing the desired linearity of phase control. In any event, in each case as described above there is an offset of the currents supplied to the cosine weighting circuit 54 relative to those supplied to the sine weighting circuit 50.

Furthermore, although the sine and cosine function weighting circuits are described above in their application to a phase shifter, it can be appreciated that these may also be useful in other applications in which it may be desired to derive weighting signals from a control signal accurately in accordance with sine and cosine functions.

Thus although particular embodiments of the invention are described in detail above, it can be appreciated that these and numerous other modifications, variations, and adaptations may be made within the scope of the invention as defined in the claims.

What is claimed is:

1. A phase shifter comprising:

a phase splitter for producing two phase quadrature signals from an input signal;

a weighting circuit for producing two weighting signals in accordance with sine and cosine functions of a control signal;

two multipliers for multiplying each of the two phase quadrature signals by a respective one of the two weighting signals to produce a respective one of two products; and a summing circuit for summing the two products to produce an output signal which is phase shifted from the input signal in dependence upon the control signal;

wherein the weighting circuit comprises two translinear sine shaping circuits each having differential current outputs providing a respective one of the two weighting signals from input currents supplied thereto, and a circuit for providing the input currents to the two sine shaping circuits in dependence upon the control signal, the input currents of the two sine shaping circuits being offset relative to one another whereby the differential current outputs of the two sine shaping circuits are provided in accordance with a sine function and a cosine function, respectively, of the control signal.

2. A phase shifter as claimed in claim 1 wherein the phase splitter comprises a polyphase network.

3. A phase shifter as claimed in claim 1 wherein the input signal comprises a high frequency signal and each of the multipliers comprises a four-quadrant multiplier.

4. A phase shifter as claimed in claim 1 wherein each of the multipliers comprises a Gilbert Cell multiplier.

5. A phase shifter as claimed in claim 1 wherein each of the multipliers comprises a Gilbert Cell multiplier.

6. A phase shifter as claimed in claim 1 wherein each of the multipliers comprises a Gilbert Cell comprising a differential pair of transistors having collectors coupled to emitters of quad transistors, wherein a respective one of the two phase quadrature signals is supplied to the bases of the differential pair of transistors, the differential current outputs of the respective sine shaping circuit are coupled to diode-connected transistors for providing a differential input to bases of the quad transistors, and a differential current output of the multiplier is derived from collectors of the quad transistors.

7. A phase shifter as claimed in claim 6 and further including two current stealing circuits each coupled to the differential current outputs of a respective one of the two sine shaping circuits for reducing current through the diode-connected transistors of the respective multiplier.

8. A phase shifter as claimed in claim 6 wherein the summing circuit comprises a differential common base amplifier coupled to the differential current outputs of the two multipliers.

9. A phase shifter as claimed in claim 1 wherein the circuit for providing the input currents to the two sine shaping circuits in dependence upon the control signal comprises a circuit for providing a reference current; a differential amplifier responsive to the control signal for producing differential control currents dependent upon the reference current and the control signal; and a plurality of current mirror circuits for producing the input currents to the two sine shaping circuits from the reference current and the differential currents.

10. An analogue method of phase shifting a high frequency input signal in dependence upon a control signal, comprising the steps of:

splitting the input signal into two components in phase quadrature;

multiplying the two phase quadrature components by respective weights determined in accordance with sine and cosine functions, respectively, of the control signal to produce respective product signals; and summing the product signals to produce a phase shifted output signal having an amplitude substantially independent of its phase shift;

wherein the step of multiplying the two phase quadrature components by respective weights comprises producing said weights as differential currents in two translinear sine shaping circuits in dependence upon currents supplied to the sine shaping circuits, and producing the currents supplied to the two sine shaping circuits in dependence upon the control signal and offset from one another for the two sine shaping circuits to provide said sine and cosine functions, respectively.

11. A method as claimed in claim 10 wherein the step of splitting the input signal into two components in phase quadrature comprises supplying the input signal to an input of, and deriving the two components in phase quadrature from outputs of, a network comprising a plurality of polyphase network sections in cascade.

12. A method as claimed in claim 10 wherein the step of multiplying the two phase quadrature components by respective weights comprises producing each of said weights as differential currents and reducing the differential currents by a fixed current.

13. A method as claimed in claim 10 wherein the step of producing the currents supplied to the two sine shaping circuits comprises the steps of providing a reference current; producing differential control currents dependent upon the reference current and the control signal; mirroring the reference current and the differential currents to produce mirrored currents, and combining mirrored currents to produce the currents supplied to the two sine shaping circuits.

14. A method as claimed in claim 10 and further comprising the step of reducing the differential currents produced by the two sine shaping circuits in each case by a fixed current.

* * * * *